United States Patent
Björkman et al.

(10) Patent No.: US 6,733,682 B1
(45) Date of Patent: May 11, 2004

(54) METHOD FOR THE MANUFACTURING OF A MATRIX AND A MATRIX MANUFACTURED ACCORDING TO THE METHOD

(75) Inventors: Henrik Björkman, Uppsala (SE); Klas Hjort, Uppsala (SE); Joakim Andersson, Uppsala (SE); Patrik Hollman, Uppsala (SE)

(73) Assignee: AMIC AB (SE)

( * ) Notice: Subject to any disclaimer, the term of this patent is extended or adjusted under 35 U.S.C. 154(b) by 144 days.

(21) Appl. No.: 10/070,868

(22) PCT Filed: Sep. 7, 2000

(86) PCT No.: PCT/SE00/01742
§ 371 (c)(1),
(2), (4) Date: Mar. 11, 2002

(87) PCT Pub. No.: WO01/20055
PCT Pub. Date: Mar. 22, 2001

(30) Foreign Application Priority Data

Sep. 10, 1999 (SE) ................................................ 9903232
Sep. 10, 1999 (SE) ................................................ 9903233

(51) Int. Cl.⁷ .................... B29C 33/38; B29C 33/56; C23C 16/27; C23C 16/32; C23C 16/34
(52) U.S. Cl. ................................ 216/9; 216/9; 216/11; 216/52; 216/83; 425/542
(58) Field of Search .............................. 216/2, 9, 11, 52, 216/83; 425/542

(56) References Cited

U.S. PATENT DOCUMENTS

| | | | |
|---|---|---|---|
| 4,546,951 A | 10/1985 | Boschman | 249/95 |
| 5,112,025 A * | 5/1992 | Nakayama et al. | 249/115 |
| 5,827,613 A * | 10/1998 | Nakayama et al. | 428/408 |
| 6,039,897 A * | 3/2000 | Lochhead et al. | 264/1.24 |
| 6,042,230 A * | 3/2000 | Neadle et al. | 351/160 R |
| 6,203,156 B1 * | 3/2001 | Wu et al. | 351/160 R |
| 6,290,882 B1 * | 9/2001 | Maus et al. | 264/2.2 |

FOREIGN PATENT DOCUMENTS

| | | | |
|---|---|---|---|
| EP | 0400672 | 12/1990 | |
| EP | 0856592 | 8/1998 | |
| GB | 2284175 | 5/1995 | |
| JP | 2170994 | 7/1990 | |
| JP | 2225688 | 9/1990 | |
| JP | 3243787 | 10/1990 | |
| JP | 4089212 | 3/1992 | |
| JP | 5169459 | 7/1993 | |
| JP | 06106543 A * | 4/1994 | B29C/33/38 |
| JP | 09199522 A * | 7/1997 | H01L/21/56 |

OTHER PUBLICATIONS

International Search Report dated Dec. 13, 2000 for Intl. Application No. PCT/SE00/01742.

* cited by examiner

Primary Examiner—Anita Alanko
(74) Attorney, Agent, or Firm—Ostrolenk, Faber, Gerb & Soffen, LLP

(57) ABSTRACT

The present invention relates to a method for the manufacture of a matrix and to a matrix (1) thus manufactured, at least one surface section (2) displaying a microstructure, which matrix (3) is suitable for inclusion as a mould insert in a mould cavity or in a cavity, in a unit producing plastic components, in order to assign said plastic components an opposing micostructure in a corresponding surface section. An original (3) with a surface section (4) displaying a microstructure less than 500 $\mu$m is used in order to apply on this original layer upon layer of a material (11, 12, 13, 14) and/or mixtures of material producing a matrix, and thereafter the matrix (1) is removed from said original (3) or the material in the original is removed. A first layer of material (11) applied on the original (3) so that together with a number of additional layers of material, said matrix is formed, is selected having exceptionally good properties as regards the ability of the plastic component to release from the matrix after moulding, curing or polymerisation of the plastic material used, and exceptionally good properties as regards retaining the pattern on the microstructured surface section.

24 Claims, 1 Drawing Sheet

METHOD FOR THE MANUFACTURING OF A MATRIX AND A MATRIX MANUFACTURED ACCORDING TO THE METHOD

TECHNICAL FIELD

The present invention relates in the first place to a method for the manufacture of a matrix using an original.

More particularly the present invention relates to a method for the manufacture of a matrix which will be able at least to display a surface section with a negative microstructure, intended for replication as a positive microstructure on an object, such as a plastic component, produced in a plastic moulding machine.

Matrices of this type are suitable for inclusion as a mould insert in a mould cavity in a unit producing plastic components, in order to assign said plastic components a positive microstructure in a corresponding surface section.

Concepts like negative or positive microstructure are used in this application solely for the purpose of being able to elucidate the altered shape of the microstructure in the matrix or in the mould-cavity insert and the replicated microstructure in the plastic component.

The invention also relates to a matrix, suitably manufactured in accordance with the method.

The manufacture of matrices in accordance with the method for the present invention is based on using an original with a surface section displaying a sharp positive microstructure in order to apply on this original at least one layer of material and/or a mixture of materials producing a matrix, this material having been selected to withstand the forces exerted on a mould-cavity insert in a machine for moulding plastic components.

When the matrix or mould-cavity insert has been completely built up, measures are taken to remove the matrix from said original or remove the material in the original, so that the microstructure-related surface section of the matrix, with a sharp negative microstructure, will appear.

The present invention relates more particularly to use in applications where the microstructure is chosen with a groove width or the like of less than 500 μm, for instance in the range of 50–0.1 μm, but may naturally be used for greater groove widths.

Although the invention indicates the possibility of forming a matrix, for inclusion in a unit producing plastic components such as a mould-cavity insert, on an original such as a silicon disc, the invention also enables a second matrix with reverse microstructure to be formed from such a matrix or the like.

BACKGROUND ART

Regarding the properties associated with the present invention it can be mentioned that patent publication EP-A1-0 400 947 shows a method to be already known for manufacturing a substantially independent diamond or diamond-like film (16) with a desired profile, the method comprising:

the application of a thin carbide layer (14) on a fixed substrate (10) having a surface (12) with a form corresponding to the desired profile, the application of a film (16) consisting of crystalline diamond or a diamond-like film, on the carbide layer (14), and removal of the substrate (10).

Patent publication EP-A10 417 924 shows a method for manufacturing moulded diamond articles, the method comprising:

the formation of a reactive gas or chemical vapour, said gas comprising active carbon and means for forming a diamond deposit on a predetermined substrate, the use of a non-flat model of predetermined shape, the surface of the model being such that a layer of diamond can be built up from said vapour, where the non-flat model is also assigned the ability to release a diamond layer formed by a chemical vapour phase being deposited thereon, the formation of a layer of synthetic diamond against the non-flat model by allowing the surface of the non-flat model to be brought into contact with the vapour under such conditions that the diamond buildup produces a synthetic diamond article, the shape of which conforms to the shape of the non-flat model, and removing the synthetic diamond article from said non-flat model.

Also pertaining to prior art is an article entitled "CVD Replication for Optics Applications" by Jitendra S. Goela and Raymond L. Taylor, published in SPIE, Vol. 1047, "Mirrors and Windows for High Power/High Energy Laser Systems" (1989), describing a deposition process using a chemical vapour in order to replicate shapes, patterns and highly reflective surfaces in optical material (ZnS, ZnSe) and mirror material (Si, SiC) transferable in infrared rays, for several applications.

A method is also known through patent publication EP-A1-0 442 303 for producing three-dimensional workpieces or components made of diamond, comprising:

a) placing a model heated to a CVD diamond-forming temperature (500 to 1100° C.) in a chamber, the model constituting a negative of the workpiece, b) applying or supplying a gas mixture of hydrocarbon/hydrogen to said chamber at a pressure of 0.013 to 1334 mbar (0.01 to 1000 torr), c) creating at least a partial degradation or decomposition of said gas mixture in, said chamber to form a CVD diamond layer on more than one surface of said model, and d) removing said model from said CVD diamond layer to produce said diamond workpiece, which will thus display the surface characteristics of the surface of the model on which it was formed.

More particularly, FIGS. 5A, 5B and 5C show a step-shaped or groove-shaped pattern manufactured from molybdenum, in which identical parallel grooves form a check pattern with 5 mm spacing after machining.

Groove 32 has a width of 0.03 inch (0.76 mm) and a depth of 0.013 inch (0.33 mm), with 5 mm between the centre lines of the grooves. The thickness of the plate is chosen as 3.81 mm.

Parts of the workpiece 34 are soldered to a carbide substrate in order to produce a cutting tool.

Methods for manufacturing a matrix with at least one surface section displaying a negative microstructure, in which the matrix is suitable for inclusion in a mould cavity, as a mould cavity insert in a unit producing plastic components, in order to assign said plastic components a corresponding surface section with corresponding positive microstructure, wherein an original with a surface section displaying a positive microstructure is used in order to apply on this original layer upon layer of material and/or mixtures of material producing a matrix, and thereafter removing the matrix from said original or removing the material in the original, are also known.

In a method as described above it is also known to coat the negative microstructure, in a subsequent treating process, with a material layer that per se has good durability qualities against stresses in the plastic moulding unit when used as a mould-cavity insert.

It is also known that each application of such additional, reinforcing materials on a matrix results in somewhat deteriorated exactitude in the negative microstructure of the matrix, and thus somewhat deteriorated quality of the positive microstructure to be transferred to the plastic component.

It is also known that the wear caused by a plastic compound on the mould-cavity insert is considerable and that the surface displaying the microstructure must be coated with a material that will stand up to wear, particularly if the plastic compound contains an abrasive filler such as quartz.

Such filler materials may also be selected from materials that will give a low thermal expansion coefficient, such as 0 or close to zero, or may offer reinforcing properties from the mechanical aspect.

The following publications also pertain to prior art in this field:

D1) Patent Abstracts of Japan, abstract of JP 2 225 668, publ. 1990-09-07 & JP-2 225 688-A and Derwent's abstract, No. 1990-316 827, week 9042.

A method is shown and described here for producing a core with an exact relief-related pattern on its surface, a non-electrical plated coating of a first layer on the surface of the core, and dipping the platedcore in an alectro-bath prior to oxidation of the non-electrical plating coating is undertaken. A strong union is ensured between the model and the non-electrical coating.

It is advocated here that an epoxy plastic is supplied via an inlet (9*b*), as a reinforcing agent (9*a*), through which a counterdie (9) is formed with a reversed pattern (8). Thereafter a non-electrical plating coating is applied on the counterdie or core (9) to produce a plated coating (10).

This coating (10) increases in hardness since a mixture of a component of a reducing agent in the plating bath and a plated metal is utilised, thus producing a reversed pattern (1).

Before the surface of the plated coating is oxidised or after the surface has been roughened, an electro-formed layer 12 is applied on the above surface.

By subsequently peeling off the above-mentioned laminating coatings of the counterdie (9), an electro-formed mould body (1) is obtained, consisting of a plated layer (10) and an electroformed layer (12), which is improved from the adhesive aspect, and has an inverted pattern (11).

D2) Patent Abstracts of Japan, abstract of JP 3 342 787, publ. 1991-10-30 & JP-3 243 787-A and Derwent's abstract, No. 1991-364 686, week 9150.

A mould (4) made of metal is shown here, provided with a mould-producing recess in the form of a deep hole (51) with a ridge (52).

In this case a master with protrusions (11 and 12) corresponding to the hole (51) and the ridge (52) consists of aluminium.

A nickel-plated layer (2), including fine hard ceramic particles of SiC, TiC, TiN, etc, is formed on the surface of the master pattern (1).

A shell (3) consisting of nickel is also formed.

The pattern is dissolved in NaOH and removed, and the remaining part of the shell (3) is shaped to a specific size and inserted in the concave part of the mould (4).

A plated layer is thus formed with a hard and uniform surface, in which the ceramic particle-shaped material is uniformly distributed and facilitates release of the moulded product from the mould.

D3) EP-400 672-A2.

A technique is shown and described here for producing a mould enabling replication of a large number of plastic components.

The mould displays a hologram or other microstructure to be transferred to the outside of a moulded article or component.

The mould is produced by electro-depositing a metal on the model of the article to be moulded.

Prior to this deposition the hologram or other microstructure shall be formed on the surface areas of the model by means of known technology.

D4) Patent Abstracts of Japan, abstract of JP 4 089 212, publ. 1992-03-23 & JP-4 089 21 2-A and Derwent's abstract, No. 1992-147 406, week 9218.

An arrangement is shown here in which plastic is introduced between a mould (1) and a glass lens (5), the plastic hardening so that a plastic layer (4) is formed on the lens (5), with an intermediately oriented carbon film (2).

D5) Patent Abstracts of Japan, abstract of JP 5 169 459, publ. 1993-07-09 & JP-5 169 459-A and Derwent's abstract, No. 1993-252 170, week 9332.

This shows a base material for a mould and part of this is coated with a hard carbon film or diamond-like carbon film (DLC-film).

D6) EP-856 592-A1

This shows and describes a substrate (1) that is covered, at least partially, with a layer (1) consisting of a number of layer build-ups (2), each such build-up comprising:

a first diamond-like layer (3) consisting of nano-composites, nearest the substrate and displaying co-operating networks of a C:H and a Si:O, a second layer (4) consisting of diamond-like composites, over said first layer (3), an intermediate layer (5) between said first and second layers, consisting of a mixture of said first and second layer, and when the number of layer structures above exceeds one (1), an additional intermediately oriented layer (7) is provided.

D7) GB-2 284 175A

This shows and describes a mould with exceptionally good release capability, particularly in the production of golf-ball cores.

Also proposed is for the mould to be covered by a tungsten carbide layer within the range of 2 to 20 $\mu$m.

D8) U.S. Pat. No. 4,546,951-A

Here a mould is shown and described for encapsulating parts in a plastic material.

A layer of hard material, such as a nitrite layer, is applied by means of vapour deposition in vacuum at a high temperature on to at least specifically selected surface areas.

DESCRIPTION OF THE PRESENT INVENTION

Technical Problems

Considering that the technical deliberations a person skilled in the art must perform in order to be able to offer a solution to one or more of the technical problems posed constitute initially an insight into the measures and/or the sequence of measures to be taken, and also a selection of the means required, the following technical problems should be relevant in developing the object of the present invention.

Considering the previous state of the art as described above, it would appear to be a technical problem to create such conditions that a matrix, produced against an original, shall have a durable first material layer for building up the matrix, where this material layer shall also display such properties that, with simple additional treatments, the matrix can be placed directly in a mould half, as a mould-cavity insert, in a unit for producing plastic components.

A technical problem exists in being able to select at least said first material layer for forming the matrix, with favourable properties appropriate for the intended future application, as regards such criteria as durability, predisposition of the plastic material to release from the microstructured surface or surfaces of the matrix, and other equivalent conditions.

A technical problem is also entailed in being able to perceive the significance of and advantages associated with having a first thin layer of material applied against the original to form the matrix, be selected with exceptionally good durability properties in the manufacture of plastic components, exceptionally good properties as regards the ability and predisposition of the plastic component to release from the matrix after moulding, curing or polymerisation of the plastic material used (low friction), and exceptionally good properties as regards retaining a sharp pattern on the microstructured surface section.

A technical problem is also entailed in being able to perceive the significance of and advantages associated with selecting a thin diamond-related material layer as said first material layer that, besides hard and durable properties, also displays low friction and exceptionally good release properties from the moulded plastic component.

It is furthermore a technical problem to be able to perceive the significance of and advantages associated with utilising application methods based on a crystalline diamond coating, such as CVD (Chemical Vapour Deposition) technology (750–800 degrees C.) or PVD (Physical Vapour Deposition) technology.

It is furthermore a technical problem to be able to perceive the significance of and advantages associated with utilising application methods based on an application of a hard and durable material layer with lower temperature requirements or DLC (Diamond-Like Carbon) layer (ca. 200 degrees C.), such as nitrides, carbides and the like.

It is thus a technical problem to select a layer produced using CVD technology or a DLC layer or some other layer material that has proved relevant for a specific application.

A technical problem is also entailed in being able to perceive the significance of selecting said first material layer with a predetermined thickness, the selected thickness being dependent on the material chosen for the first material layer, the shape and dimensions of the microstructure, and the choice of plastic material and of filler.

It would also appear to be a technical problem to be able to choose a material and/or a material mixture in a second and/or a third layer (an intermediate layer) in combination with a chosen thickness for the material in these layers.

A technical problem is also entailed in being able to perceive the significance of and advantages associated with selecting a utilised original in the form of a silicon disc or the like, with a positive microstructure thereon, and in having said silicon disc removable by means of a basic etching after the matrix has been built up.

A technical problem is also entailed in being able to perceive the significance of selecting KOH, NaOH or similar liquids for said basic etching.

A technical problem is also entailed in being able to perceive the significance of and advantages associated with selecting a mixture of DLC and Ni as a second material layer.

A technical problem is also entailed in being able to perceive the significance of selecting said second material layer with a thickness appropriate to the application.

A technical problem is also entailed in being able to perceive the significance of utilising a third material layer and, in that case, selecting only nickel or at least primarily nickel to form the third material layer.

A technical problem is furthermore entailed in being able to perceive the significance of selecting said third material layer with a thickness appropriate to the application.

A technical problem is also entailed in being able to perceive the significance of selecting a plating of nickel material as a fourth material layer and in selecting a thickness of said layer appropriate to the application.

A technical problem is also entailed in being able to perceive the significance of applying said first material layer, consisting of a DLC layer, by means of a sputtering process.

A technical problem is also entailed in being able to perceive the significance of applying said second material layer, consisting of a mixture of DLC and Ni, by means of a sputtering process.

Solution

In order to solve one or more of the above technical problems, the point of departure for the present invention is a method for the manufacture of a matrix, and a matrix thus produced, with at least one surface section displaying a microstructure, which matrix is suitable for inclusion in a mould cavity or in a cavity, while forming a mould insert, in a unit producing plastic components, in order to assign said plastic components an opposing microstructure in a corresponding surface section, an original being used in order to apply on this original layer upon layer of a material and/or mixtures of materials producing a matrix, and thereafter remove the matrix from said original or, preferably, remove the material in the original in order to expose the matrix and the surface pertaining to the microstructure.

In such a known method, it is proposed according to the invention that a first layer of material is applied against the original so that, together with a number of additional layers of material, said matrix is formed, that the first layer of material is selected having exceptionally good durability properties in the manufacture of plastic components, exceptionally good properties as regards the ability of the plastic component to release from the matrix after moulding, curing or polymerisation of the plastic material used, and exceptionally good properties as regards retaining the pattern on the microstructured surface section.

Preferred embodiments falling within the scope of the inventive concept include the selection of a hard, durable, thin layer of material with low friction and good release properties from the plastic material, for said first layer of material.

Said first material layer may be a crystalline diamond layer, such as a DLC layer or a layer that can be applied using CVD technology and/or PVD technology (Physical Vapour Deposition).

For certain applications the first material layer could also consist of nitrides, carbides and the like.

The first material layer should be applied to a thickness of 0.1–100 $\mu$m.

A second material layer, with good adhesive capability to the first material layer, is applied on the first, where the second material layer may consist of DLC, titanium and/or chromium.

Said second material layer should be applied to a thickness of 0.05–2.0 $\mu$m.

A third material layer, with good adhesive capability to the second material layer, is applied on the second layer and said third material layer may consist of a nickel layer.

Said third material layer should be applied to a thickness of 0.05–2.0 μm.

Said second material layer and said third material layer may also be combined to an intermediately oriented layer having a chosen high DLC proportion or a high titanium and/or chromium concentration at a boundary surface to said first material layer and a high nickel concentration at a boundary surface to a bulk material in the form of a fourth layer, serving as mechanical support.

Said first material layer may preferably be chosen having a thickness of 1–15μm.

The invention also advocates selecting a treated silicon disc or the like with a chosen microstructure, as an original, and that said silicon disc can be removed by means of a basic etching.

The use of KOH, NaOH or equivalent basic liquids are proposed for this basic etching.

According to the invention a mixture of DLC and nickel may be selected as a second material layer.

Said second material layer may preferably be chosen having a thickness of 0.05–1.0 μm.

The invention also proposes applying a third layer of material and selecting nickel for this third material layer.

Said third material layer may then be chosen having a thickness of 0.05–1.0 μm.

As a fourth layer of material the invention proposes that this be applied in a plating process and shall consist of pure nickel.

Said fourth material layer may be chosen with a thickness appropriate for the application.

The invention particularly advocates application of a DLC layer or similar by means of a sputtering process in combination with the application of DLC and nickel, serving as a second material layer, by means of a sputtering process.

The third material layer may also be applied by means of a sputtering process.

The second and the third material layers may also be applied, integrated, by means of a sputtering process.

The ratio between the proportion of DLC and the proportion of nickel shall advantageously be chosen varying through the layer and with 50% of each in the mid-region of the layer.

Advantages

The advantages that may primarily be deemed significant for a method in accordance with the present invention, and a matrix manufactured in accordance with the method, are that conditions have been created to be able, in a simple manner, to create a matrix suitable for a mould-cavity insert, with a hard, durable, thin and sharp microstructured surface facing towards the plastic material in a moulding tool.

The material in this thin layer, which may comprise a DLC layer of 0.1–100 μm, is such and so chosen that the microstructured surface of the matrix will display good release properties with regard to a chosen plastic material and the pattern in the matrix can be retained intact over a long period of time.

A matrix in accordance with the invention is built up of a number of thin layers of material and a thick layer of bulk material, serving as mechanical support.

What is primarily deemed characteristic of a method for manufacturing a matrix in accordance with the present invention is defined in the characterizing part of the appended claim 1, and for a matrix preferably manufactured by means of the method, is defined in the characterizing part of the appended claim 27.

BRIEF DESCRIPTION OF THE DRAWINGS

A currently proposed matrix manufactured in accordance with the above method, and various methods for manufacturing the matrix will now be described in more detail with reference to the accompany drawings, in which.

DESCRIPTION OF PREFERRED EMBODIMENTS

Figure 1:
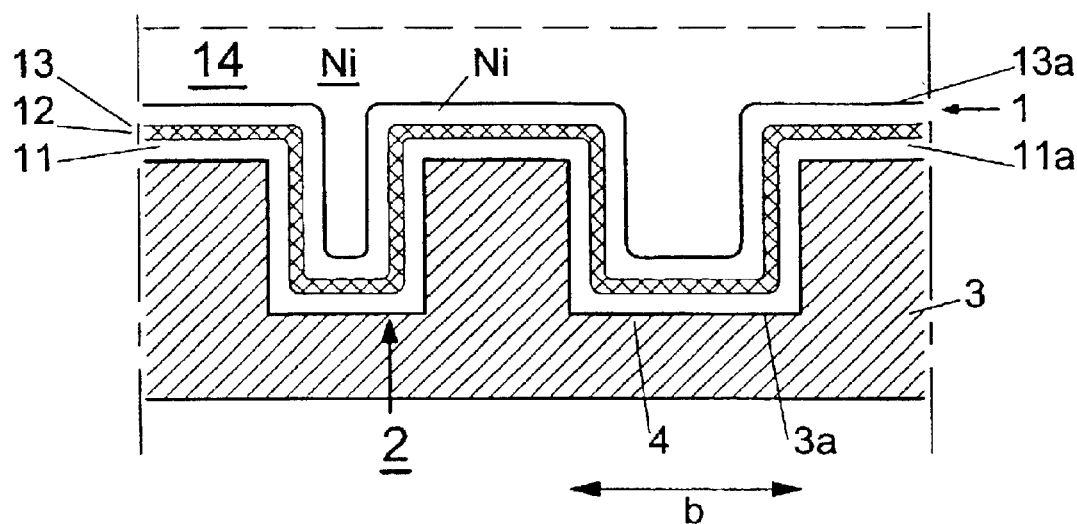
FIG. 1 shows a cross section through an original, to which a matrix has been applied, built up of a number of layers of material, in accordance with the present invention.

Assuming that an original or master 3 has been removed, FIG. 1 shows a matrix 1 with at least one surface section 2 displaying a negative microstructure, the matrix being suitable for inclusion as a mould-cavity insert in a mould or cavity in a unit producing plastic components, in order to assign said plastic components a corresponding surface section with a positive microstructure.

This is not shown in more detail in the drawings but constitutes a familiar circumstance to one skilled in the art.

The invention relates to a method and a matrix 1 manufactured in accordance with the method.

The method assumes the existence of an original 3, and that this original has been provided in known manner with a microstructured surface 4, which surface is to serve as a counter-surface for a matrix 1 built up on the original 3.

An original 3 having a surface section 4 provided with a positive microstructure shall thus be used, and layer upon layer of a material and/or mixtures of materials producing a matrix shall be applied on the original 3, the matrix 1 there after being removed from said original 3 or, preferably the material in the original being removed, thereby exposing the microstructured surface or surface section 2 of the matrix 1.

The present invention advocates the use of a first durable layer of material 11 applied against the original 3 in order, together with a second, a third, and/or a fourth material layer serving as mechanical support and as bulk material, these layers being designated 12, 13 and 14, to form the complete matrix 1.

Said first layer of material 11 shall be selected from material having exceptionally good strength properties in the production of plastic components, exceptionally good properties as regards the ability of the plastic component to release (low friction) from the matrix after moulding, curing or polymerisation of the plastic material used, and exceptionally good properties as regards retaining a sharp pattern on the microstructured surface section.

A hard, durable, thin material layer with low friction and/of good release properties shall be chosen as said first material layer 11.

A crystalline diamond layer or a DLC layer is particularly recommended for the first material layer 11.

It is suggested that the first material layer 11 may be applied by means of CVD technology and/or PVD technology.

For certain applications the first material layer might also consist of nitrides, carbides and the like.

Practical experience dictates that the first material layer 11 shall be applied to a thickness of 0.1–100 μm, e.g. 0.5–50 μm, or more precisely 1–15 μm. However, this depends on the plastic material, the filler chosen, application and microstructure.

A second material layer 12, with good adhesive capability to the first material layer 11, is now applied on the first material layer 11.

Said second material layer 12 may consist of titanium and/or chromium, or of a mixture of DLC and nickel.

Said second material layer 12 should be applied to a thickness of 0.05–2.0 µm, e.g. 0.1–1.0 µm.

A third material layer 13, with good adhesive capability to the second material layer 12, is now applied on the second layer 12.

Said third material layer 13 is recommended to consist of nickel.

Said third material layer 13 is applied to a thickness of 0.05–2.0 µm, e.g. 0.1–1.0 µm.

Said second material layer 12 and said third material layer 13 may, however, be combined to an intermediately oriented layer having a purely diamond layer and/or a high titanium and/or chromium concentration at a boundary surface 11a against said first material layer 11 and a high nickel concentration at a boundary surface 13a against a bulk material in the form of a fourth layer 14, serving as mechanical support.

A crystalline diamond layer or other material layer with equivalent, or at least substantially equivalent properties, may be used for said materials for the application shown here.

Said first material layer' shall normally be chosen having a thickness of 1–15 µm.

An embodiment of the invention is shown by way of example in which a treated silicon disc 3 with a positive microstructure 4 is selected as original, and said silicon disc is removed by means of a basic etching. Liquids, KOH, NaOH or the like may be selected in a chosen concentration for the basic etching.

The invention also shows the use of a second material layer 12 and this may be chosen as a mixture of DLC and nickel, with a predetermined ratio of the ingredients.

Said second material layer 12 may advantageously be chosen having a thickness of 0.05–1.0 µm.

The embodiment also illustrates the selection of nickel for the third material layer.

Said third material layer 13 may be chosen having a thickness of 0.05–1.0 µm.

A fourth material layer 14 is chosen consisting of a nickel plating and said fourth material layer may be chosen with a thickness appropriate for the application.

The present invention particularly advocates the first layer 11, such as the DLC layer, being applied by means of a sputtering process. This has been found suitable in distributing the DLC layer well along the microstructured surface section 4.

According to the invention a second material layer, in the form of a mixture of DLC and nickel, may also be applied, said second material layer 12 being applied by means of a sputtering process on the first layer 11 in order to obtain good adhesion between them. A high proportion of DLC shall thus abut the layer 11 and a high proportion of nickel shall face the layer 14, and the layer 13 may be omitted.

The third material layer 13 is also applied by means of a sputtering process.

The second and the third material layers 12, 13 may be applied, integrated, by means of a sputtering process.

Figure 2:
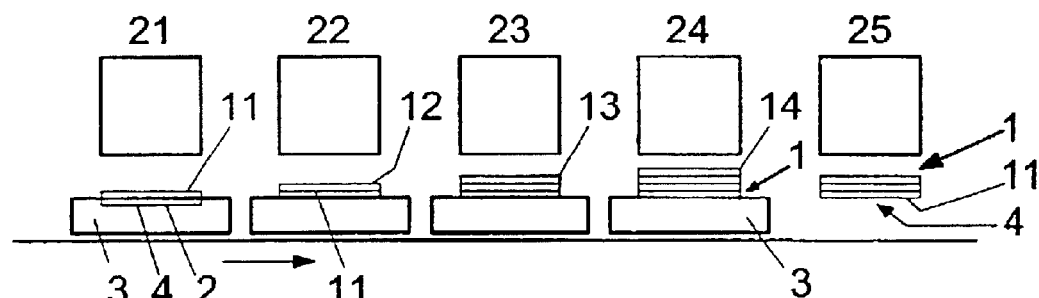
FIG. 2 shows schematically a method in accordance with the invention, adapted to a production line for producing a matrix in accordance with FIG. 1.

FIG. 2 illustrates how an original 3, provided with a microstructure-related surface section 4 is coated with a first DLC layer 11, or corresponding layer, in a first station 21, by means known per se, through a sputtering process.

By subsequently moving the original 3 to an adjacent station 22, merely indicated in FIG. 2, the first layer 11 can be coated with a second layer 12 by means of a sputtering process. The second layer 12 is necessary in order to obtain good adhesion to the first layer 11 and may be termed an intermediate layer.

The second layer 12 may consist of titanium or chromium. Or it may consist of a mixture of DLC and nickel.

Further transfer of the original 3 to a station 23 allows a third layer 13 to be applied on the second layer 12, also by means of a sputtering process. The original 3 is finally transferred to a station 24 for application of a fourth material layer 14 by means of plating.

A combined unit consisting of a matrix 1 and an original 3, as shown in FIG. 1, exists after station 24 and in a station 25 conditions are now created for being able to remove the material in the original 3 by means of said basic etching, thereby revealing a matrix 1 which is directly suitable for use in a mould half in a unit for producing plastic components, with an extremely good and exact microstructure 4.

Figure 3:
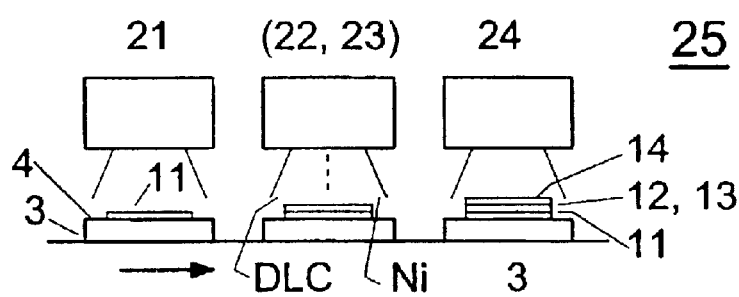
FIG. 3 shows schematically a process in accordance with the invention, adapted to an alternative production line for producing a matrix as shown in FIG. 1, with a second and a third layer integrated with each other.

FIG. 3 shows one embodiment of a production line in which a station 21, as shown in FIG. 2, applies a first material layer 11 on the original 3 and its microstructured surface portion 4.

A station (22, 23) is here so designed that when the original 3 passes, the material layer 11 is coated first with a very high proportion of DLC and a very small proportion of nickel (designated DLC in FIG. 3), and as the original 3 is moved along in the direction of the arrow, the same surface portion of the layer 11 will be coated with a mixture of DLC and nickel in which the proportion of DLC decreases in favour of an increased share of nickel which, near the right-hand part of FIG. 3, constitutes an overwhelming proportion, e.g. 100% (designated Ni in FIG. 3).

The material layer 14 is applied to a suitable thickness in a plating station 24.

It can also be ascertained that certain applications require the use of a crystalline diamond layer 11, to provide a hard and durable material layer 11 as a thin material film.

If low friction and good release properties are to appear between the plastic component and the microstructured surface 4, and if a temperature as high as 750–800 degrees C. may be permitted, the use of the CVD diamond process is recommended here.

A hard surface with hardwearing properties can also be achieved at lower temperatures, e.g. 200° C. if DLC, nitrides and/or carbides are used for the first material layer 11. Titanium nitride, titanium carbide, aluminium oxides and mixtures thereof may also be used.

The layer 12, or the combination of layers 12 and 13, is constituted by an intermediate layer. This shall on the one side adhere well to the layer 11, and on the other side adhere well to the layer 14.

The adhesion between layers 11 and 12 or between 11 and 12+13 requires crystalline diamond, titanium or chromium, and the adhesion between layers 13 and 14 requires nickel.

If the material chosen for the layer 12 is titanium or chromium, the material chosen in the layer 13 may be nickel.

The original 3 may be manufactured in accordance with lithographic processes, using masking and etching, machining and the like.

If the material layers 12 and 13 are integrated, the total thickness of these may be between 0.1–3 µm, e.g. 0.5–1.5 µm.

Furthermore, the dimension of the microstructure applicable for the present invention shall be measured as indicated by -b- in FIG. 1. It is thus the width of the microstructure-related grooves that is decisive for the measurement, not the depth of the grooves.

In a practical application of the present invention it may be mentioned that the value of -b- may be chosen with advantage from approximately 500 $\mu$ and down to 0.20–0.5 $\mu$m.

The invention is applicable: when the width of the microstructure is chosen within the narrowest interval and is such that the material layer 11 will completely fill and cover the groove 3a, thus forming a seal. This is not, however, shown in FIG. 1 but can easily be imagined.

The favourable, harmonic fit of the layers 11, 12 and 13 to each other in the groove 3a is, however, exaggeratedly simple in FIG. 1.

The choices of material stated in the above example, and the choices of material stated in the claims, may be considered as currently recommended and may be replaced with other choices without departing from the inventive concept.

The invention is naturally not limited to the embodiment described above by way of example but may undergo modifications within the scope of the inventive concept illustrated in the appended claims.

What is claimed is:

1. A method for the manufacture of a matrix having at least one surface section or layer displaying a negative microstructure, the matrix being suitable for inclusion as a mould insert in a mould cavity or in a cavity in a unit for producing plastic components, in order to assign at least one part or surface of said plastic components an opposing or positive microstructure in a corresponding surface section, whereby said layer is exposing the conditions of hardness and wear resistance, the method comprising forming said matrix by providing an original having a surface section displaying a positive microstructure; applying onto said original successive layers of different materials or mixtures of materials for building up and producing said matrix, and thereafter either removing said matrix from said original or removing the material building up said original to manufacture a microstructure related surface section of the matrix, that has a sharp negative microstructure;
   a. wherein said surface section related to the original is caused to display said positive microstructure,
   b. wherein said first matrix related layer is a material having an ability to release the matrix surface from the produced plastic components after moulding, curing or polynerization,
   c. wherein said selected material, according to "b", also retains the pattern on the negative microstructured surface section related to said first layer,
   d. wherein said material in said first layer is a crystalline diamond, a DLC, a nitride, or a carbide,
   e. wherein said first layer is applied onto said original in a thickness of 0,1–100 $\mu$m; and
   f. wherein a second material layer, having an adhesive capability to the first material layer, is applied onto said first material layer.

2. A method as claimed in claim 1, wherein said second material layer consists of titanium and/or chromium.

3. A method as claimed in claim 1, wherein said second material layer is applied in a thickness of 0.05–2.0 $\mu$m.

4. A method as claimed in claim 1, wherein a third material layer, with adhesive capability to said second material layer, is applied onto the second layer.

5. A method as claimed in claim 4, wherein said third material layer consists of nickel.

6. A method as claimed in claim 4 wherein said third material layer is applied in a thickness of 0.05–2.0 $\mu$m.

7. A method as claimed in claim 4, wherein said second material layer and said third material layer are combined to an intermediately oriented layer, having a high DLC, titanium or chromium concentration at a boundary surface against said first material layer and a nickel concentration at a boundary surface against a bulk material, in the form of a fourth layer and said fourth layer serving as mechanical support.

8. A method as claimed in claim 1, wherein said first material layer has a thickness of 1–15 $\mu$m.

9. A method as claimed in claim 1, wherein said original comprises a treated silicon disc, with a chosen microstructure, the method comprising removing said silicon disc by a basic etching process.

10. A method as claimed in claim 9, wherein said basic etching is with KOH or NaOH.

11. A method as claimed in claim 1, wherein said second material layer is a mixture of DLC or the equivalent and nickel.

12. A method as claimed in claim 1, wherein said second material layer has a thickness of 0.05–1.0 $\mu$m.

13. A method as claimed in claim 4, wherein said third material layer is of nickel only.

14. A method as claimed in claim 4, wherein said third material layer has a thickness of 0.05–1.0 $\mu$m.

15. A method as claimed in claim 4, wherein a fourth material layer is applied as a plating of a nickel material.

16. A method as claimed in claim 15, wherein said fourth material layer is chosen with a thickness appropriate for an application.

17. A method as claimed in claim 1, further comprising applying said DLC layer by a sputtering process.

18. A method as claimed in claim 1, further comprising applying said second material layer by a sputtering process.

19. A method as claimed in claim 4, further comprising applying said third material layer by a sputtering process.

20. A method as claimed in claim 4, further comprising applying said second and third material layers by a sputtering process.

21. A matrix manufactured according to the method of claim 1.

22. A matrix manufactured according to the method of claim 4.

23. A matrix manufactured according to the method of claim 7.

24. A matrix manufactured according to the method of claim 13.

* * * * *